(12) United States Patent
Compagno

(10) Patent No.: US 7,978,529 B1
(45) Date of Patent: Jul. 12, 2011

(54) REWRITABLE SINGLE-BIT-PER-CELL FLASH MEMORY

(75) Inventor: Giuseppe Compagno, Palermo (IT)

(73) Assignee: Micron Technology, Inc., Boise, ID (US)

( * ) Notice: Subject to any disclaimer, the term of this patent is extended or adjusted under 35 U.S.C. 154(b) by 273 days.

(21) Appl. No.: 12/344,157

(22) Filed: Dec. 24, 2008

(51) Int. Cl.
*G11C 11/34* (2006.01)
(52) U.S. Cl. .......... 365/185.24; 365/185.17; 365/185.01
(58) Field of Classification Search ............. 365/185.24, 365/185.17, 185.01
See application file for complete search history.

(56) References Cited

U.S. PATENT DOCUMENTS 7,474,577 B2 * 1/2009 Crippa et al. ................. 365/211
7,768,828 B2 * 8/2010 Lee .......................... 365/185.03

\* cited by examiner

*Primary Examiner* — Son T Dinh
*Assistant Examiner* — Nam T Nguyen
(74) *Attorney, Agent, or Firm* — Berkeley Law & Technology Group, LLP

(57) ABSTRACT

Subject matter disclosed herein relates to multilevel flash memory, and more particularly to a method of changing a logic level of a single-bit-per-cell flash memory device multiple times before an erase operation.

20 Claims, 7 Drawing Sheets

REWRITABLE SINGLE-BIT-PER-CELL FLASH MEMORY

BACKGROUND

1. Field

Subject matter disclosed herein relates to flash memory devices.

2. Information

Flash memory devices typically involve an erase operation to change a logic level of an already programmed memory cell. Such an erase operation is typically applied to an entire sector, page, and/or block of memory cells in a flash memory device. Accordingly, writing to a flash memory, such as to change a logic value of one or more memory cells is typically a relatively slow process.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a flash memory device, such as a NAND and/or a NOR flash memory device, may include one or more multilevel flash memory cells that may be used to store a single bit per cell instead of storing multiple bits per cell. Such a single bit may include one of either a high logic level or a low logic level. Accordingly, such a multilevel flash memory cell may include a transistor having a floating gate that can accommodate multiple voltage levels that individually correspond to a single bit. In a particular embodiment, to change a logic level of a single bit in a memory cell, electrical charge may be added to the transistor's floating gate to change from one such voltage level to the next voltage level. Adding electrical charge to the floating gate may be repeated to change the logic level of the single bit stored in the memory cell multiple times, from high to low and/or from low to high, until a maximum voltage threshold of the floating gate is reached. After such a maximum voltage threshold is reached, an erase operation may be applied to the memory cell to begin a new cycle of multiple write operations to the memory cell. A write controller and a read controller may be provided to operate such a multilevel flash memory device that accommodates single bit per cell memory, as explained below.

In an embodiment, a memory cell may include a transistor having a floating gate located between a control gate and a channel region of the transistor. A threshold voltage of such a transistor may be programmed or erased by charging or discharging the floating gate. An amount of electrical charge on a floating gate of a transistor may determine which voltage is to be applied to a control gate of the transistor to result in a charge carrier inversion in an underlying channel region. An amount of charge on a floating gate therefore may determine a threshold voltage of a transistor. Accordingly, data may be written to such memory cells by charging or discharging floating gates of transistors in the memory cells to achieve threshold voltages corresponding to the data.

Figures 1A, 1B:
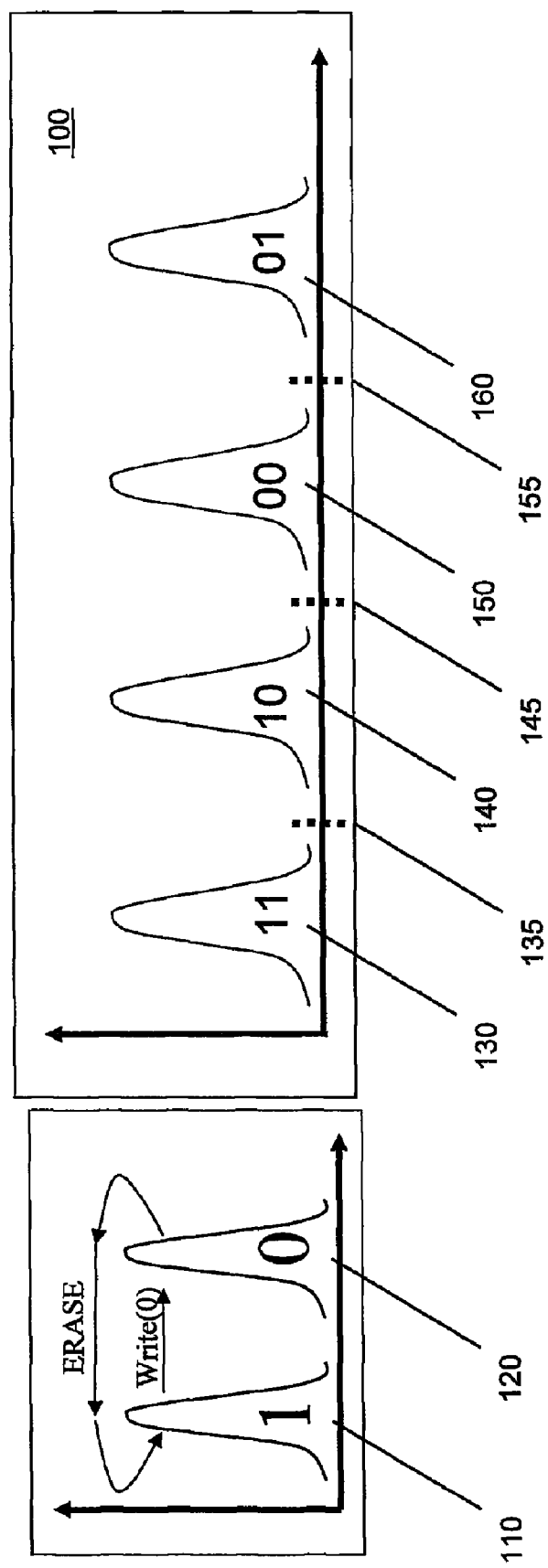
FIG. 1A is a schematic view of a write operation for a single-level memory cell, according to an embodiment.
FIG. 1B is a schematic view of two-bit levels stored in a multilevel memory cell, according to an embodiment.

FIG. 1A is a schematic view of a write operation for a single-level memory cell, according to an embodiment. In this example, a floating gate of a transistor (not shown) in such a memory cell may begin at a charge level 110 to store a high logic level, or a "1". Next, the logic level may be changed once by writing a "0" to the memory cell by adding charge to the floating gate, for example. As a result, the floating gate in the memory cell may be at a charge level 120, corresponding to storing a low logic level, or a "0". An erase operation may be needed to further change the logic level stored in the memory cell. Unfortunately, such an erase operation may involve all memory cells in the same sector, page, and/or block, as mentioned above.

In another embodiment, a multilevel memory device may store multiple bits per memory cell, as shown in FIG. 1B, which is a schematic view of two-bit levels stored in a multilevel memory cell 100. Such a memory cell may include a transistor that includes a range of threshold voltages that may be partitioned into a number of states or levels 130, 140, 150, and 160 corresponding to possible multibit data values stored in the memory cell, for example. Such states or levels, which may include voltage ranges, may be separated by cut-off voltages, such as cut-off voltage 135 shown between levels 130 and 140 as examples. In a particular implementation, a memory device that stores two bits of data per memory cell may include a range of suitable threshold voltages for individual memory cells that may be partitioned into two or more states or levels. Returning to FIG. 1B as an example, a first level 130 may include a threshold voltage below first cut-off 135. A second level 140 may include a threshold voltage between the first cut-off and a second cut-off 145. A third level 150 may include a threshold voltage between the second cut-off and a third cut-off 155, and a fourth level 160 may include a threshold voltage above the third cut-off, and so on. Individual levels may correspond to two-bit data, such as "11" in level 130, "10" in level 140, "00" in level 150, and "01" in level 160, for example.

Figure 2:
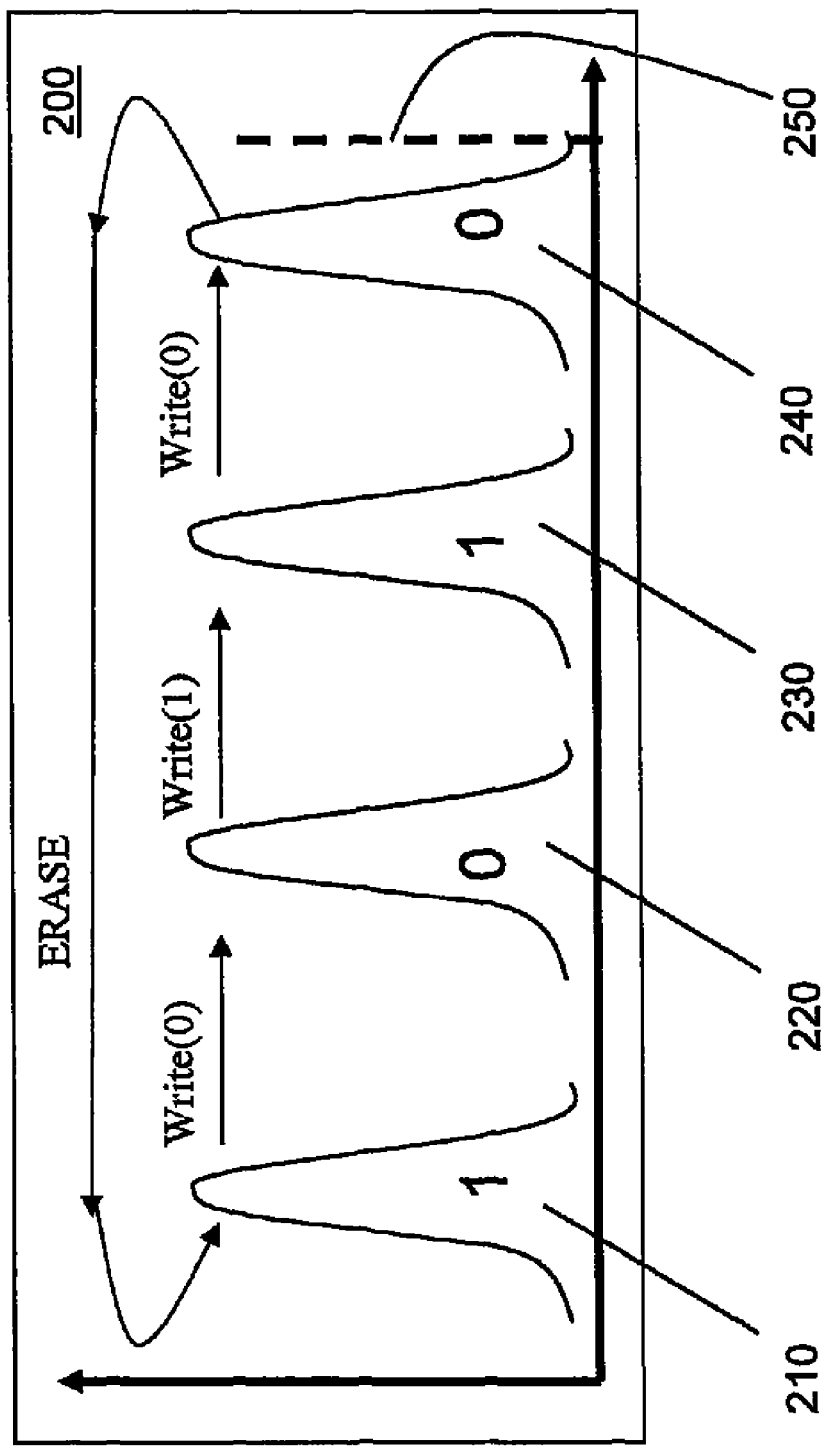
FIG. 2 is a schematic view of single-bit levels stored in a multilevel memory cell, according to an embodiment.

In yet another embodiment, a multilevel memory device may store a single bit per memory cell, as shown in FIG. 2, which is a schematic view of single-bit voltage levels stored in a multilevel memory cell 200. As in the case described above for a memory cell 100 that may store multiple bits per cell, multilevel memory cell 200 may include a transistor that includes a range of threshold voltages that may be partitioned into a number of states or levels 210, 220, 230, and 240 corresponding to high and low logic levels stored in the memory cell. Such states or levels, which may include voltage ranges, may be separated by cut-off voltages, as in the case for memory cell 100 shown in FIG. 1B. For example, a memory device that stores a single bit of data per memory cell may include a range of suitable threshold voltages for individual memory cells that may be partitioned into two or more states or levels. A first level, for example, may include a threshold voltage below a first cut-off. A second level may include a threshold voltage between the first cut-off and a second cut-off. A third level may include a threshold voltage between the second cut-off and a third cut-off, and a fourth level may include a threshold voltage above the third cut-off, and so on. Of course, the number of levels is only an example, and claimed subject matter is not so limited.

A threshold voltage of a transistor in a multilevel memory cell may be programmed multiple times by charging a floating gate of the transistor corresponding multiple times. A total amount of electrical charge on the floating gate may determine a threshold voltage of a transistor. Accordingly, data may be written to such a multilevel memory cell by charging a floating gate of a transistor in the memory cell multiple times to achieve threshold voltages corresponding to a single bit of data.

Figure 3:
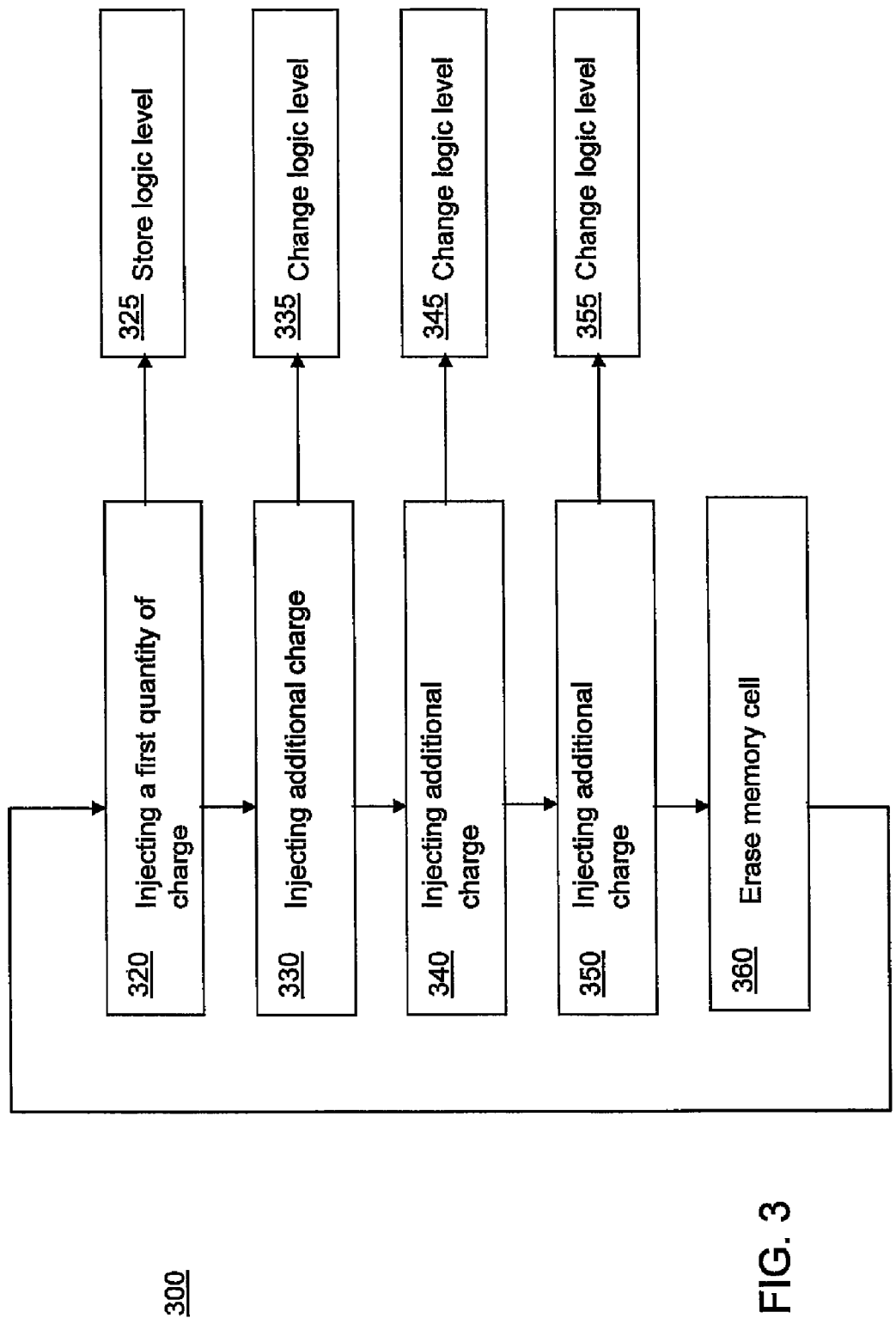
FIG. 3 is a flow diagram of a process to program a flash memory cell multiple times, according to an embodiment.

FIG. 3 is a flow diagram of a process 300 to store and change a single bit of data in a multilevel memory cell of a flash memory device, according to an embodiment. At blocks 320 and 325, a first logic level may be stored as a single logic bit in a multilevel flash memory cell by injecting a first quantity of electrical charge into a floating gate of a transistor in the multilevel memory cell. Returning to FIG. 2, such a transistor of a memory cell may start with a floating gate (not shown) at a charge or voltage level 210 to store a high logic level, or a "1". Next, the logic level may be changed by writing a "0" to memory cell 200 by injecting additional charge to the floating gate, as in blocks 330 and 335. As a result, the floating gate of memory cell 200 may be at a voltage level 220, corresponding to storing a low logic level, or a "0". Next, the logic level of the memory cell may be changed again by writing a "1" to the memory cell by adding additional charge to the floating gate, as in blocks 340 and 345. As a result, the floating gate of the transistor of memory cell 200 may be at a voltage level 230, corresponding to storing a high logic level, or a "1". Again, the logic level may be changed by writing a "0" to the memory cell by adding additional charge to the floating gate, as in blocks 350 and 355. As a result, the floating gate of the transistor of memory cell 200 may be at a voltage level 240, corresponding to storing a low logic level, or a "0". At block 360, an erase operation may further change the logic level stored in the memory cell as described. In other words, referring to FIG. 2, to change a logic level of multilevel memory cell 200 after the floating gate is at voltage level 240, an erase operation may be employed to remove charge from the floating gate of the memory cell. Such an erase operation may be used, for example, if a charge on floating gate is close to, or reaches a maximum threshold voltage 250, as explained below.

As described above, a quantity of electrical charge may be added to a floating gate of a transistor in a multilevel memory cell to change a logic level stored in the memory cell. In an embodiment, a sum of quantities of electrical charge added each time to the floating gate to change the logic level may be less than or equal to a maximum threshold voltage for the multilevel memory cell. In order to change a logic level of a multilevel memory cell without exceeding its maximum threshold voltage, an erase operation may be implemented. Of course, such an implementation of an erase operation is merely an example of changing a logic level of such a memory cell, and claimed subject matter is not so limited.

Figure 4:
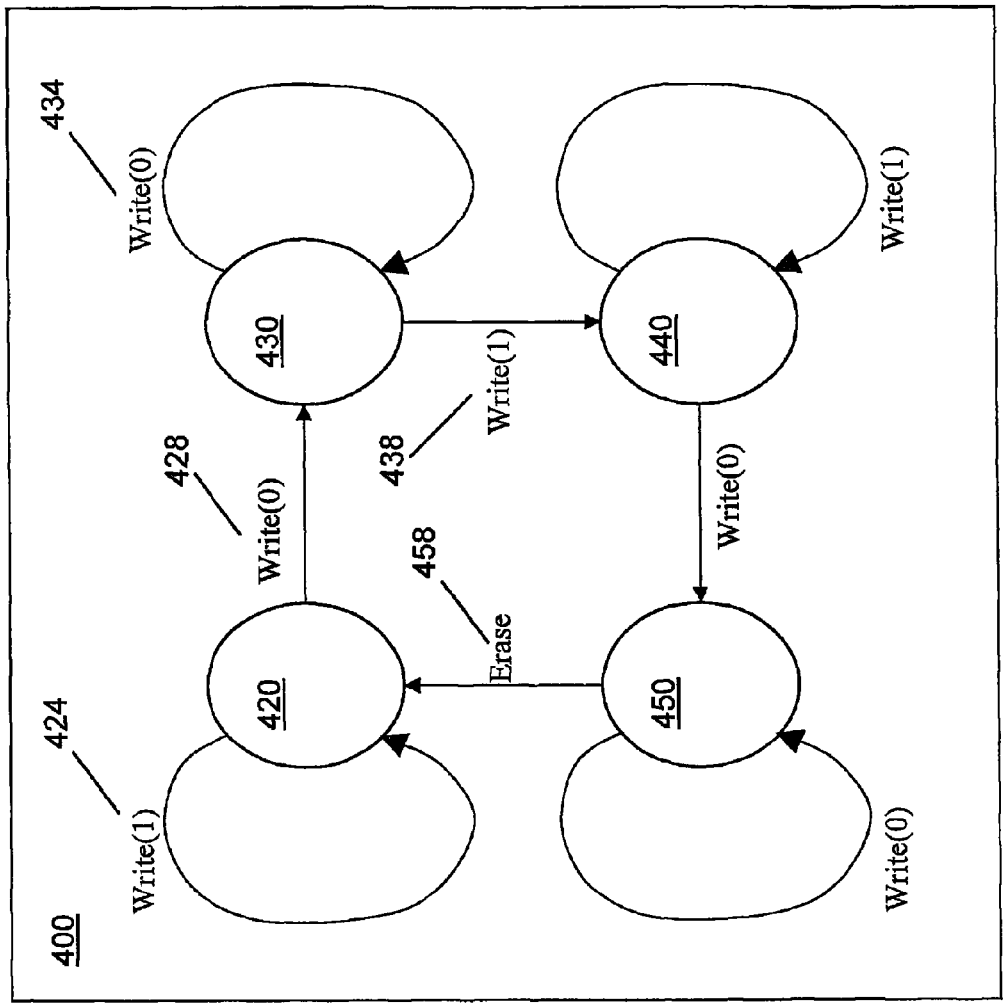
FIG. 4 is a schematic view of multiple write operations and an erase operation for a multi-level memory cell that stores a single bit, according to an embodiment.

FIG. 4 is a schematic view of multiple write operations and an erase operation for a multilevel memory cell 400 that may store a single a single bit, according to an embodiment. Multilevel memory cell 400 may comprise four threshold voltage levels at which to store a single bit comprising either high or low logic states. For example, a lowest threshold voltage level, such as threshold voltage level 210 shown in FIG. 2, may correspond to a high logic state 420. A write operation 424 to store a "1" applied to multilevel memory cell 400 need not change the threshold voltage level of the memory cell, and logic state 420 may maintain a high logic level (continues to store a "1" bit). On the other hand, applying a write operation 428 to store a "0" in multilevel memory cell 400 may increase the threshold voltage level of the memory cell by injecting charge into a floating gate of a transistor in memory cell 400, for example. Such a new threshold voltage of memory cell 400, such as threshold voltage level 220 shown in FIG. 2, may correspond to a low logic state 430. Continuing with an example, a write operation 434 to store a "0" applied to multilevel memory cell 400 need not change the threshold voltage level of the memory cell, and logic state 430 may maintain a low logic level (continues to store a "0" bit). On the other hand, applying a write operation 438 to store a "1" in multilevel memory cell 400 may increase the threshold voltage level of the memory cell by injecting charge into the floating gate of a transistor of memory cell 400, for example. Such a new threshold voltage of memory cell 400, such as threshold voltage level 230 shown in FIG. 2, may correspond to a high logic state 440. Such a process of writing to memory cell 400 may continue to change or maintain a logic level of memory cell 400 up to a voltage threshold level that corresponds to logic level 450, for example. If such a voltage threshold level is relatively near a maximum voltage threshold level for the memory cell, then an erase operation 458 may be needed to change logic level 450. After such an erase operation, the writing process shown in FIG. 4 may be repeated.

Figure 5:
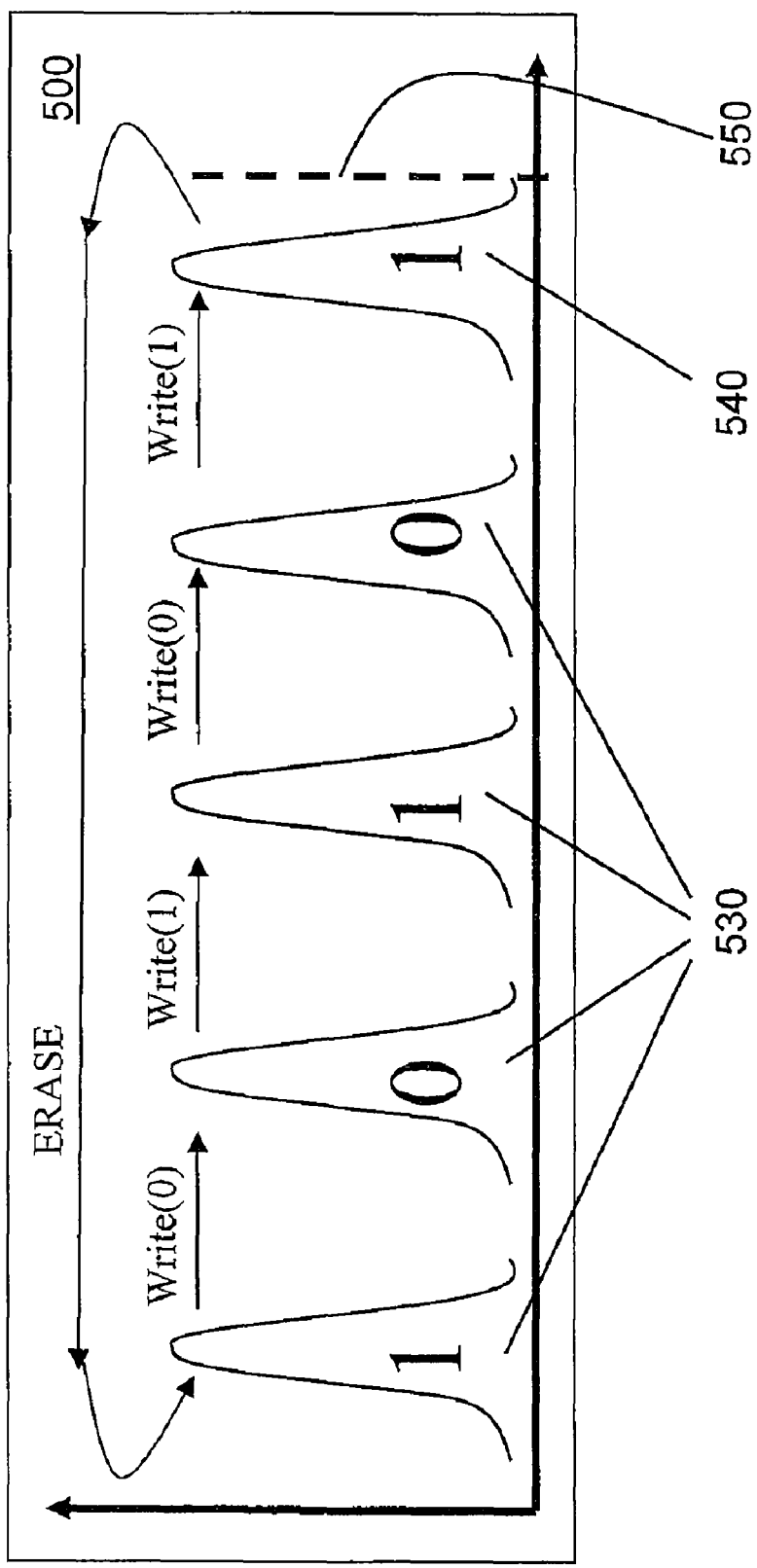
FIG. 5 is a schematic view of multiple write operations for a multilevel memory cell that stores a single bit, according to another embodiment.

FIG. 5 is a schematic view of multiple write operations for a multilevel memory cell 500 that may store a single bit, according to another embodiment. Such a memory cell may be similar to memory cell 200 shown in FIG. 2, for example, but memory cell 500 may include five voltage threshold levels 530 and 540. In one particular embodiment, the addition of another voltage threshold level 540, compared to memory cell 200 for example, may be accommodated by utilizing a memory cell transistor (not shown) having a higher maximum voltage threshold 550 than that of memory cell 200. For example, a maximum voltage threshold 250 for memory cell 200 may be 3.3 volts, whereas a maximum voltage threshold 550 for memory cell 500 may be 5.0 volts. Such a higher maximum voltage threshold 550 may provide a larger voltage range to accommodate an additional voltage threshold level 540. In another particular embodiment, the addition of voltage threshold level 540 may be realized by maintaining a maximum voltage threshold but compressing voltage threshold levels 530 to accommodate the addition of new voltage threshold level 540. In other words, voltage threshold levels 530 may be closer to one another compared to voltage threshold levels 210, 220, 230, and 240. For example, voltage threshold levels 210, 220, 230, and 240 for four-level memory cell 200 may have voltage ranges 1.0 to 1.2 volts, 2.0 to 2.2 volts, 3.3 to 3.5 volts, and 4.8 to 5.0 volts, respectively. To compare, compressed voltage threshold levels 530 and 540 for five-level memory cell 500 may have voltage ranges 1.0 to 1.2 volts, 1.8 to 2.0 volts, 2.8 to 3.0 volts, 3.8 to 4.0 volts, and 4.8 to 5.0 volts, respectively. As explained above, once a maximum voltage threshold of a transistor of a memory cell is reached, such as maximum voltage threshold 550 in FIG. 5, an erase operation may be needed to change the logic level at 540. Of course, such voltage ranges are merely examples, and claimed subject matter is not so limited.

Figure 6:
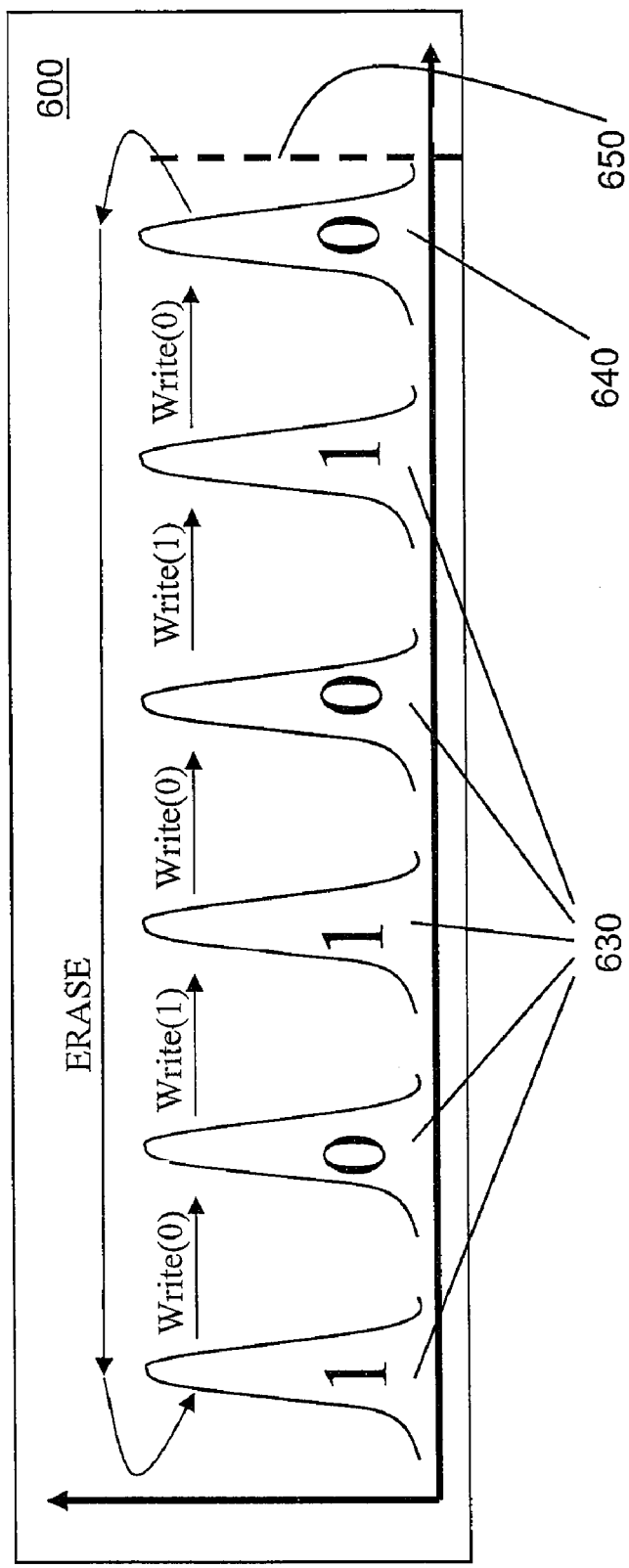
FIG. 6 is a schematic view of multiple write operations for a multilevel memory cell that stores a single bit, according to yet another embodiment.

In an embodiment, a multilevel memory cell may include any number of voltage threshold levels, and claimed subject matter is not limited to four or five levels as shown in examples above. To illustrate yet another example of multiple voltage threshold levels, FIG. 6 is a schematic view of multiple write operations for a multilevel memory cell 600 that includes additional voltage threshold levels. Such a memory cell may be similar to memory cell 500 shown in FIG. 5, for example, but memory cell 600 may include six voltage threshold levels 630 and 640. In one particular embodiment, the addition of another voltage threshold level 640, compared to memory cell 500 for example, may be accommodated by utilizing a transistor having a higher maximum voltage threshold 650 than that of memory cell 500. In another particular embodiment, the addition of another voltage threshold level 640, may be realized by maintaining a maximum voltage threshold but compressing voltage threshold levels 630 to accommodate the addition of new voltage threshold level 640, as described above for memory cell 500. Again, as explained above, once a maximum voltage threshold is reached, such as maximum voltage threshold 650 in FIG. 6, an erase operation may be needed to change the logic level at 640.

Figure 7:
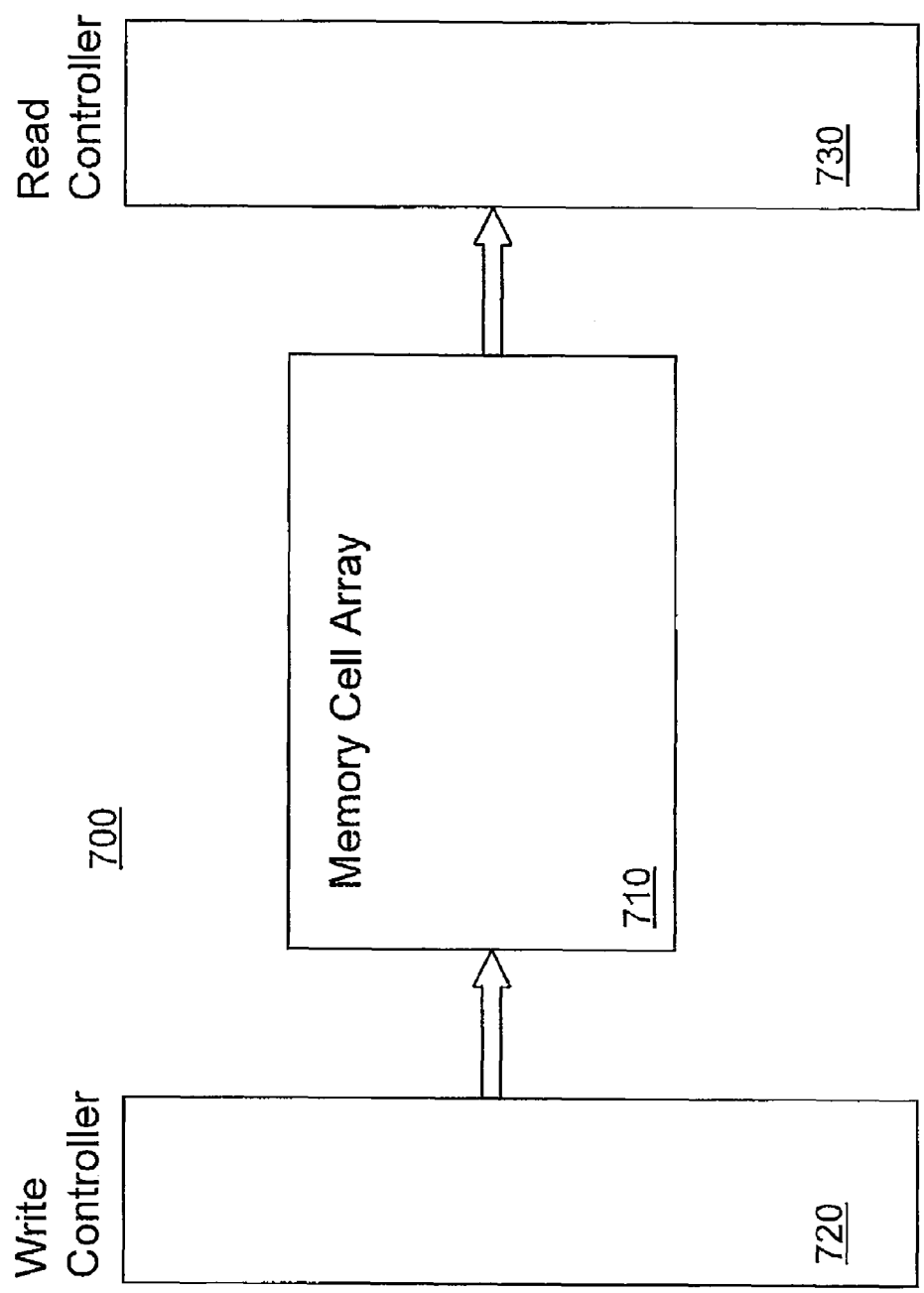
FIG. 7 is a schematic view of a multilevel memory device that stores a single bit, according to an embodiment.

FIG. 7 is a schematic view of a multilevel flash memory device 700, according to an embodiment. Such a memory device may comprise a memory cell array 710 including multilevel flash memory cells to store multiple bits, such as memory cell 100 shown in FIG. 1B, for example. Though such memory cells may be able to store multiple bits, a write controller 720 may be adapted to inject electrical charge into a floating gate of the multilevel flash memory cell to store a single logic bit. Write controller 720 may, for example, use process 300 shown in FIG. 3 to store single bit logic levels. In such a process, for example, write controller 720, may inject additional electrical charge into a memory cell transistor's floating gate to change a logic level of a stored single logic bit. In a particular embodiment, write controller 720 may change a logic level of a stored single logic bit one or more times without erasing the memory cell, as shown in process 300 of FIG. 3. Also in such a process, write controller 720 may erase memory cell array 710 that includes a plurality of multilevel memory cells to further change a logic level of a stored single logic bit after changing the logic level one or more times, for example.

On an output side of memory cell array 710, in a particular embodiment, a read controller 730 may be adapted to interpret an output of the multilevel flash memory cell as a single logic bit. For example, read controller 730 may include a combination of sense amplifiers and decoders (not shown) that may interpret output levels of a multilevel memory cell to be single bit logic values. For example, referring to FIG. 2, read controller 730 may be adapted to interpret an output of memory cell 200 corresponding to either one of voltage threshold levels 210 and 230 as a logic high, or "1", and an output of memory cell 200 corresponding to either one of voltage threshold levels 220 and 240 as a logic low, or "0".

It should also be understood that, although particular embodiments have been described, claimed subject matter is not limited in scope to a particular embodiment or implementation. For example, one embodiment may be in hardware, such as implemented to operate on a device or combination of devices, for example, whereas another embodiment may be in software. Likewise, an embodiment may be implemented in firmware, or as any combination of hardware, software, and/or firmware, for example. Such software and/or firmware may be expressed as machine-readable instructions which are executable by a processor. Likewise, although claimed subject matter is not limited in scope in this respect, one embodiment may comprise one or more articles, such as a storage medium or storage media. This storage media, such as one or more CD-ROMs and/or disks, for example, may have stored thereon instructions, that when executed by a system, such as a computer system, computing platform, or other system, for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive, although, again, claimed subject matter is not limited in scope to this example.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
    storing a first logic level as a single logic bit in a multilevel flash memory cell by injecting a first quantity of electrical charge into a floating gate of said multilevel flash memory cell; and
    changing said first logic level of the stored single logic bit to a second stored single bit logic level by injecting a second quantity of electrical charge into said floating gate of said multilevel flash memory cell, wherein said first logic level and said second logic level comprise two states of said single logic bit stored in said multilevel flash memory cell.

2. A method comprising:
    storing a first logic level as a single logic bit in a multilevel flash memory cell by injecting a first quantity of electrical charge into a floating gate of said multilevel flash memory cell;
    changing said single logic bit to a second logic level by injecting a second quantity of electrical charge into said floating gate of said multilevel flash memory cell; and
    changing said single logic bit from said second logic level to said first logic level by injecting a third quantity of electrical charge into said floating gate of said multilevel flash memory cell.

3. The method of claim 2, further comprising:
    changing said single logic bit from said first logic level to said second logic level by injecting a fourth quantity of electrical charge into said floating gate of said multilevel flash memory cell.

4. The method of claim 3, wherein a sum of said first, second, third, and fourth quantities of electrical charge is less than or equal to a maximum threshold voltage for said multilevel flash memory cell.

5. The method of claim 4, further comprising:
erasing said multilevel flash memory cell to change a logic level of said single logic bit if said maximum threshold voltage is reached.

6. The method of claim 3, wherein said multilevel flash memory cell comprises a portion of a NOR flash memory.

7. The method of claim 3, wherein said multilevel flash memory cell comprises a portion of a NAND flash memory.

8. A multilevel flash memory device comprising:
a memory cell array including a multilevel flash memory cell adapted to store multiple bits;
a write controller adapted to inject an electrical charge into a floating gate of said multilevel flash memory cell to store a single logic bit; and
a read controller adapted to interpret an output of said multilevel flash memory cell as said single logic bit stored in said multilevel flash memory cell.

9. The multilevel flash memory device of claim 8, wherein said write controller is further adapted to inject additional electrical charge into said floating gate of said multilevel flash memory cell to change a logic level of said single logic bit.

10. The multilevel flash memory device of claim 8, wherein said read controller is further adapted to interpret two or more different output levels of said multilevel flash memory cell as a same logic level of said single logic bit.

11. The multilevel flash memory device of claim 8, wherein said write controller is further adapted to change a logic level of said single logic bit one or more times without erasing said multilevel flash memory cell.

12. The multilevel flash memory device of claim 11, wherein said write controller is further adapted to erase said memory cell array to further change said logic level of said single logic bit after changing said logic level said one or more times.

13. The multilevel flash memory device of claim 8, wherein said memory cell array comprises a portion of a NOR flash memory.

14. The multilevel flash memory device of claim 8, wherein said memory cell array comprises a portion of a NAND flash memory.

15. An apparatus comprising:
means for storing a first logic level as a single logic bit in a multilevel flash memory cell by injecting a first quantity of electrical charge into a floating gate of said multilevel flash memory cell; and
means for changing said first logic level of the stored single logic bit to a second stored single bit logic level by injecting a second quantity of electrical charge into said floating gate of said multilevel flash memory cell, wherein said first logic level and said second logic level comprise two states of said single logic bit stored in said multilevel flash memory cell.

16. The apparatus of claim 15, wherein said multilevel flash memory cell comprises a portion of a NOR flash memory.

17. An apparatus comprising:
means for storing a first logic level as a single logic bit in a multilevel flash memory cell by injecting a first quantity of electrical charge into a floating gate of said multilevel flash memory cell;
means for changing said single logic bit to a second logic level by injecting a second quantity of electrical charge into said floating gate of said multilevel flash memory cell; and
means for changing said single logic bit from said second logic level to said first logic level by injecting a third quantity of electrical charge into said floating gate of said multilevel flash memory cell.

18. The apparatus of claim 17, further comprising:
means for changing said single logic bit from said first logic level to said second logic level by injecting a fourth quantity of electrical charge into said floating gate of said multilevel flash memory cell.

19. The apparatus of claim 18, wherein a sum of said first, second, third, and fourth quantities of electrical charge is less than or equal to a maximum threshold voltage for said multilevel flash memory cell.

20. The apparatus of claim 19, further comprising:
means for erasing said multilevel flash memory cell to change a logic level of said single logic bit if said maximum threshold voltage is reached.

* * * * *